US008097302B2

(12) United States Patent
Korotkov et al.

(10) Patent No.: US 8,097,302 B2
(45) Date of Patent: Jan. 17, 2012

(54) ELECTROCONDUCTIVE TIN OXIDE HAVING HIGH MOBILITY AND LOW ELECTRON CONCENTRATION

(75) Inventors: Roman Y. Korotkov, Boothwyn, PA (US); David A. Russo, Audubon, PA (US); Thomas D. Culp, La Crosse, WI (US); Gary S. Silverman, Chadds Ford, PA (US); Pierre Beaujuge, King of Prussia, PA (US)

(73) Assignee: Arkema Inc., King of Prussia, PA (US)

( * ) Notice: Subject to any disclaimer, the term of this patent is extended or adjusted under 35 U.S.C. 154(b) by 0 days.

(21) Appl. No.: 12/684,354

(22) Filed: Jan. 8, 2010

(65) Prior Publication Data

US 2010/0117035 A1 May 13, 2010

Related U.S. Application Data

(62) Division of application No. 11/578,485, filed as application No. PCT/US2005/013830 on Apr. 21, 2005, now Pat. No. 7,662,431.

(60) Provisional application No. 60/565,061, filed on Apr. 23, 2004.

(51) Int. Cl.
*C23C 16/06* (2006.01)
*C23C 16/40* (2006.01)

(52) U.S. Cl. ......... 427/255.34; 427/255.28; 427/255.32; 427/255.35

(58) Field of Classification Search ........................ None
See application file for complete search history.

(56) References Cited

U.S. PATENT DOCUMENTS 4,040,892 A 8/1977 Sargent et al.
4,149,308 A * 4/1979 Smith ............................ 438/20
4,601,917 A 7/1986 Russo et al.
5,057,244 A 10/1991 Nitta et al.
5,147,688 A * 9/1992 Melas ...................... 427/255.32
6,533,965 B1 3/2003 Sasaki et al.

OTHER PUBLICATIONS

Park, Journal of Materials Chemistry, 2001, V11, p. 2346-2349.*
Ghadhi, Applied Physics Letters, Jun. 1979, V34, p. 833.*
SAFC, Tetramethyltin data sheet (evidence).*
Nieminen, Journal of Materials Chemistry, 1996, V6, p. 27-31.*
Abstract-Elangovan et al., "Studies on Optical Properties of Polycrystalline SnO2:Sb thin Films Prepared Using SnCI2 Precursor", Crystal Research and Technology, 2003, 38(9), pp. 779-784.
Abstract—Barsan et al., "Mechanisim of Gas Detection in Polycrystalline Thick Film Tin Dioxide Sensors", Thin Solid Films 1989, 171(1), pp. 53-63.
Ji, Zhenguo, et al, "Fabrication and Characterization of Indium-doped P-type SnO2 Thin Films", Journal of Crystal Growth, (2003), pp. 282-285.

(Continued)

*Primary Examiner* — Timothy Meeks
*Assistant Examiner* — Joseph Miller, Jr.
(74) *Attorney, Agent, or Firm* — Steven D. Boyd; Kimberly R. Hild

(57) ABSTRACT

Tin oxide having high mobility and a low electron concentration, and methods for producing layers of the tin oxide layers on a substrate by atmospheric pressure chemical vapor deposition (APCVD) are disclosed. The tin oxide may undoped polycrystalline n-type tin oxide or it may be doped polycrystalline p-type tin oxide. When the layer of tin oxide is formed on a crystalline substrate, substantially crystalline tin oxide is formed. Dopant precursors for producing doped p-type tin oxide are also disclosed.

10 Claims, 2 Drawing Sheets

OTHER PUBLICATIONS

Bagheri-Mohagheghi, M., et al., "The influence of Al doping on the electrical, optical and structural properties of SnO2 transparent conducting films deposited by the spray pyrolysis technique", Journal of Physics D: Applied Physics, (2004).

Bagheri-Mohagheghi, M., et al., "Electrical, optical and structural properties of Li-doped SnO2 transparent conducting films deposited by the spray pyrolysis technique: a carrier-type conversion study", SemiCond. Sci. Technol. 19, (2004).

Ohno, T., et al., "Microscopic Characterization of Polycrystalline APCVD CdTe Thin Film PV Devices", Materials Research Society Symposium Proceedings (2001).

Korotkov, R., et al, "Transport Properties of Undoped and NH3-doped Polycrystalline SnO2 with Low Background Electron Concentrations", Journal of Applied Physics, vol. 96, No. 11, (2004) pp. 6445-6453.

Kanamori, M., et al., "Analysis of the Change in the Carrier Concentration of SnO2 Thin Film Gas Sensor", Jpn. J. Appl. Phys. vol. 33 (1994) pp. 6680-6683.

Dominguez, J., et al., "Epitaxial SnO2 Thin Films Grown on (1012) Sapphire by Femtosecond Pulsed Laser Deposition", Journal of Applied Physics, vol. 91, No. 3, (2002), pp. 1060-1065.

Fonstad, C., et al., "Electrical Properties of High-Quality Stannic Oxide Crystals", Journal of Applied Physics, vol. 42, No. 7, (1971), pp. 2911-2918.

Chopra, K., et al, "Transparent Conductors—A Status Review", Thin Solid Films, 102, (1983), pp. 1-46.

Kim, Y-W., et al, "Microstructural evolution and electrical property of Ta-doped SnO2 films grown on Al2O3 (0001) by metalorganic chemical vapor deposition", Thin Solid Films 405 (2002) 256-262.

* cited by examiner

ELECTROCONDUCTIVE TIN OXIDE HAVING HIGH MOBILITY AND LOW ELECTRON CONCENTRATION

CROSS-REFERENCE TO RELATED APPLICATIONS

This application is a divisional and claims priority under 35 USC 120 of U.S. application Ser. No. 11/578,485, filed Jul. 13, 2007 now U.S. Pat. No. 7,662,431, which claims priority under 35 USC 119 to PCT/US2005/13830, filed Apr. 21, 2005, which claims priority to U.S. provisional application 60/565,061, filed Apr. 23, 2004, each of which is incorporated herein by reference.

FIELD OF THE INVENTION

This invention relates to tin oxide having high mobility and low electron concentration and to a method for producing layers of tin oxide on a substrate by atmospheric pressure chemical vapor deposition (APCVD).

BACKGROUND OF THE INVENTION

Because their good light transparency, wide band gap of 3.6 eV at room temperature (RT), and high chemical stability, tin oxide ($SnO_2$) layers, films, or coatings find multiple applications in transparent electrodes, panel displays, heat reflection coatings, heterojunction solar-cells, thermal layers protecting widescreens, and gas sensors. These applications require conducting layers with variable electrical and optical properties that can be tuned to the requirements of specific applications.

The electrical properties of current, undoped polycrystalline tin oxide layers or films are usually very poor. Typical mobilities of undoped polycrystalline tin oxide layers deposited on glass are not more than 35 $cm^2/Vs$ with electron concentrations being in excess of $10^{19}$ $cm^{-3}$, respectively. Thus, there is a need for conductive tin oxide layers or coatings with improved electrical properties.

SUMMARY OF THE INVENTION

In one aspect, the invention is a composition comprising a layer of an undoped, n-type polycrystalline conductive tin oxide on a substrate, in which the undoped, n-type polycrystalline conductive tin oxide has the following electrical properties at room temperature:

a) a mobility of at least 50 $cm^2/Vs$; and b) an electron concentration of less than $1\times10^{18}$ $cm^{-3}$.

In another aspect, the invention is a composition comprising doped, p-type tin oxide on a substrate. In yet another aspect, the invention is a method for forming a composition comprising a layer of conductive tin oxide on a substrate. The tin oxide may undoped n-type polycrystalline tin oxide or it may be doped p-type polycrystalline tin oxide. When the layer of tin oxide is formed on a crystalline substrate, substantially crystalline tin oxide is formed.

DETAILED DESCRIPTION OF THE INVENTION

Figure 1:
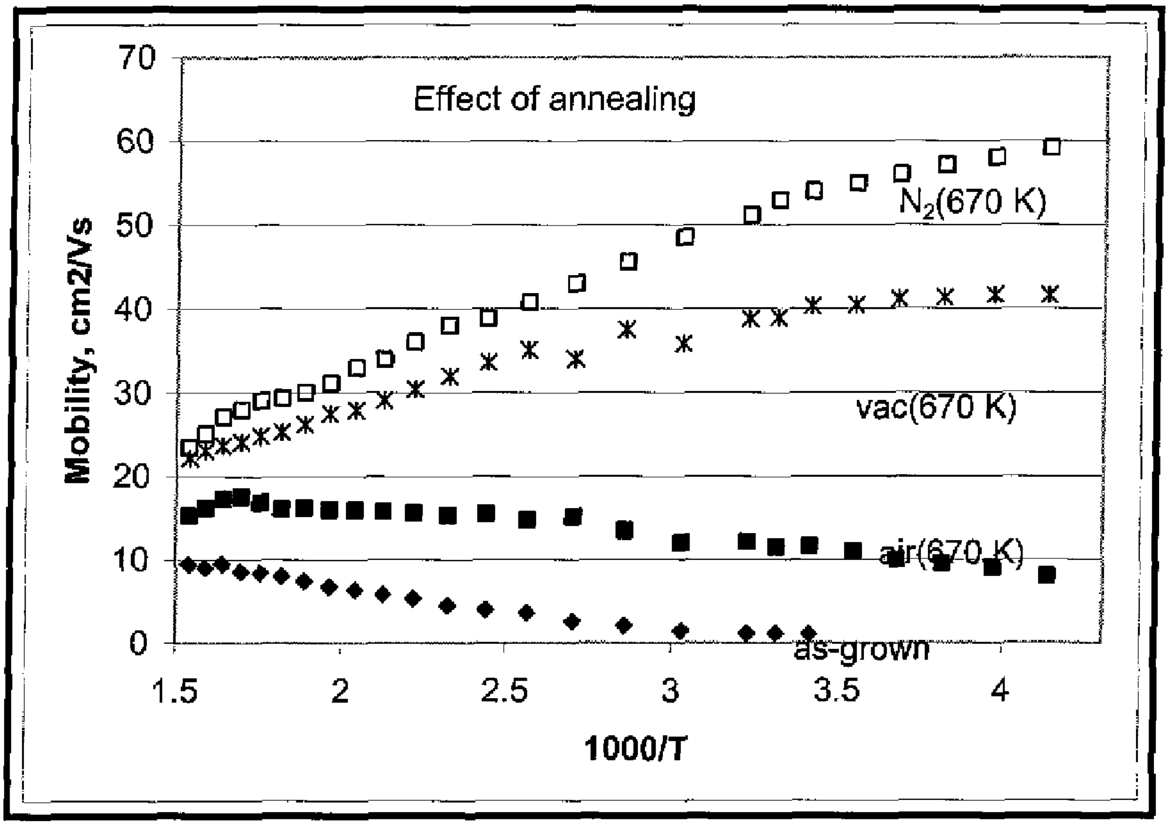
FIG. 1 is a graph showing mobility as a function of measurement temperature under different annealing conditions.

Unless the context indicates otherwise, in the specification and claims, the terms dopant, dopant precursor, tin oxide precursor, and similar terms also include mixtures of such materials. Unless otherwise specified, all percentages are percentages by weight and all temperatures are in degrees Centigrade (degrees Celsius). Room temperature (RT) is about 20° C.

In one aspect, the invention is a layer of undoped, n-type polycrystalline, conductive tin oxide on a substrate. The tin oxide has a room temperature electron mobility of at least 50 $cm^2/Vs$ and an electron concentration of less than $1\times10^{18}$ $cm^{-3}$. Preferably, the electron concentration is less than $1\times10^{17}$ $cm^{-3}$, more preferably less than $5\times10^{16}$ $cm^{-3}$, and most preferably 0.5 to $5\times10^{16}$ $cm^{-3}$. Preferably the electron mobility is 50 to 150 $cm^2/Vs$, more preferably above 60 $cm^2/Vs$, and most preferably 70-250 $cm^2/Vs$ or higher at room temperature. As shown in Table 1, these properties approach those achieved by single crystal tin oxide layers, 250 $cm^2/Vs$, and $7\times10^{15}$ $cm^{-3}$.

The quality of these tin oxide layers is especially apparent when low-temperature electrical properties are measured. At 100-120 K, a layer of n-type, undoped polycrystalline tin oxide has a mobility of greater than 360 $cm^2/Vs$ and an electron concentration of $1\times10^{17}$ $cm^{-3}$.

For comparison, the mobilities (μ) and electron concentrations (n) at 300 K (about 27 C) of polycrystalline and single crystal tin oxide samples grown by a variety of techniques on different substrates are shown in Table 1. As can be seen from Table 1, typical mobilities of undoped n-type polycrystalline tin oxide are about 10-35 $cm^2/Vs$. Though not being bound by any theory or explanation, it has been suggested that the polycrystalline nature of the tin oxide and the presence of impurities are both causes of this mobility limitation. See, R. Y. Korotkov, et al. *J. Appl. Phys.* 96, 6445 (2004).

TABLE 1

| Growth | Dopant | μ, $cm^2$/Vs | N, $cm^{-3}$ | substrate | structure | Reference |
|---|---|---|---|---|---|---|
| APCVD | F | 30 | $2\text{-}5 \times 10^{20}$ | glass | Poly | 3 |
| PACVD | Undoped | 30 | $10^{18}$ | glass | Poly | 4 |
| Sprayed | Sb | 23 | $8 \times 10^{20}$ | glass | Poly | 1 |
| Sprayed | F | 22 | $5 \times 10^{20}$ | glass | Poly | 1 |
| PLCVD | Undoped | 35 | $7 \times 10^{18}$ | r-$Al_2O_3$ | epitaxial | 5 |
| CVD | Undoped | 20 | $3 \times 10^{18}$ | c-$Al_2O_3$ | Poly | 6 |
| CVD | Ta | 10 | $10^{21}$ | c-$Al_2O_3$ | Poly | 6 |
| CVD | Undoped | 250 | $7 \times 10^{15}$ | — | Single crystal | 2 |

References:
1 K. L. Chopra et al, Thin Solid Films 102, 1 (1983);
2 C. G. Fonstad, et al., J. Appl. Phys. 42, 2911 (1971);
3 A. S. Gilmore, et al., Mat. Res. Soc. Symp. Proc. 666, F3.10.1 (2001);
4 M. Kanamori, et al. Jpn. J. Appl. Phys. 33, 6680 (1994);
5 J. E. Dominguez, et al., J. Appl. Phys. 91, 1060 (2002);
6 Y-W Kim, et al., Thin Solid Films 405, 256 (2002).

In another aspect, the invention is a method for forming layers of tin oxide having high mobility and low electron concentration on a substrate using atmospheric pressure chemical vapor deposition (APCVD). As is well known to those skilled in the art, APCVD is a chemical vapor deposition process carried out at atmospheric pressure. Equipment for carrying out APCVP is commercially available, from, for example, SierraTherm, Watsonville, Calif. USA, and is also described, for example, in Russo, U.S. Pat. No. 4,601,917, the disclosure of which is incorporated herein by reference.

Tin oxide precursor vapor in a carrier gas is directed onto a heated substrate, resulting in the deposition of a tin oxide layer on the substrate. A carrier gas comprising a mixture of nitrous oxide ($N_2O$), nitrogen gas ($N_2$ or nitrogen), and oxygen gas ($O_2$ or oxygen) produces tin oxide layers with superior electrical properties. Preferred flow rates are: nitrogen—2-20 L/min; nitrous oxide—1-10 L/min; and oxygen—20-160 $cm^3$/min. More preferred flow rates are nitrogen—3-16 L/min; nitrous oxide—2-6 L/min; and oxygen—40-120 $cm^3$/min. Most preferred flow rates are nitrogen—4-10 L/min; nitrous oxide—2-4 L/min; and oxygen—50-100 $cm^3$/min. Flow rates of: nitrogen—3 L/min; nitrous oxide—8 L/min; and oxygen—80 sccm produce a tin oxide layer having excellent electrical properties. The flow rate of the tin oxide precursor is typically about 0.05-0.4 mmole/min, more typically about 0.1-0.2 mmole/min.

The tin oxide precursors include vaporizable, substantially halogen-free tin compounds. Useful tin oxide precursors include, for example, compounds such as: tin (II) acetate; dibutyltin dimethoxide, and tin compounds of the formulas $R_4Sn$, $R_xSn(O_2CR')_{4-x}$, and $R_xSn(OR')_{4-x}$, where each R is independently a $C_1$-$C_6$ straight, branched, aliphatic, cycloaliphatic or unsaturated hydrocarbyl; each R' is independently a $C_1$-$C_4$ straight, branched, aliphatic cycloaliphatic or unsaturated hydrocarbyl; and x is 1 or 2. Typical R groups include, for example, methyl, ethyl, vinyl, n-propyl, i-propyl, n-butyl, sec-butyl, n-pentyl, and n-hexyl. Typical R' groups are methyl, ethyl, vinyl, n-propyl, i-propyl, n-butyl. Tin compounds having this formula include, for example, tetramethyltin, tetravinyltin, tetrabutyltin, tetraoctyltin, dimethyltin diacetate, and dibutyltin diacetate. A preferred tin oxide precursor is tetrabutyltin.

The tin oxide precursor should be substantially halogen-free and should not contain any traces of d transition metals and/or f transition metals. These materials can act as shallow and deep defects in tin oxide. The tin oxide precursor should be especially free of the halogens chlorine, bromine, and iodine. As is well known, "f transition metals" are the lanthanoids (atomic numbers 57-70) and the actinoids (atomic numbers 89-102); and "d-transition metals" are elements in Groups 3-12 (atomic numbers 21-30; 39-48; 71-80; and 103-112). Preferably, the tin oxide precursor comprises less about 0.01 weight percent total halides and less than about 0.01 weight percent total d and f transition metals. Purification of the tin oxide precursor may be accomplished by, for example, chromatography and/or distillation. Tetrabutyltin, for example, may be doubly distilled to increase its purity to at least 99.9%.

The tin oxide layers may be deposited on any amorphous or crystalline substrate such as, for example, glasses such as borosilicate and soda lime silica; thermoplastic and thermoset polymers such as polyolefins, polyvinyl chloride, polyacrylates and methacrylates, fluoropolymers, polyethylene terephthalate, polyethylene naphthanate, polycarbonates, urethanes, epoxies, phenolics, or copolymers thereof; silicon; sapphire; titanium oxide; quartz; alpha-alumina; amorphous silicon dioxide; and crystalline silicon dioxide. A preferred amorphous substrate is borosilicate glass. Preferred crystalline substrates include silicon, alpha-alumina and titanium dioxide.

The n- and p-type electrical properties of the tin oxide layers may be further improved when a crystalline substrates, such as silicon, sapphire or titanium dioxide is used. Tin oxide layer layers with a texture coefficient of at least about 0.99 may be formed. Tin oxide layers grown of on Si(100), for example, are substantially crystalline having a texture coefficient of 0.99, as shown by X-ray diffraction.

Preferably the substrate is heated to a temperature of about 25° C. to about 650° C. Borosilicate glass and soda lime glass substrates were preferably heated to about 450-650° C. The best electrical properties were obtained when the temperature of the top surface of a glass substrate was about 600±20° C. Thermoplastic and thermoset polymer substrates are preferably between about 25° C. and about 250° C.

Layers as thin as 300 nm may be prepared on substrates, such as, for example, borosilicate glass or amorphous or crystalline silicon. On borosilicate glass, electrical properties of the undoped layers or films improved with the increasing layer thickness. High mobilities were obtained for layers with thicknesses of 1 μm to 2 μm. However, thicker layers, up to 10 μm for example, will have improved electrical properties.

The electrical properties of the tin oxide layers can be improved by high temperature annealing, preferably at a temperature greater than about 400 K and less than 700 K. There are two major effects observed when the tin oxide layers are annealed either in vacuum or under nitrogen at 410 K, 510 K, and 610 K. First, annealing increases the room temperature mobility and electron concentration of the tin oxide. Second, annealing increases low temperature mobility. However, layers annealed at 700 K exhibit some degradation in electrical properties.

When the electrical properties of an as-grown tin oxide layer are very poor, for example, μ about 1 $cm^2$/Vs and n about $10^{18}$ $cm^{-3}$, the electrical properties of the layer can be recovered by high temperature annealing in vacuum or under nitrogen. As shown in FIG. 1, annealing of the tin oxide layer is effective in producing low electron concentration, high electron mobility properties.

In another aspect, the invention is a doped p-type tin oxide layer on a substrate. p-Type tin oxide layers may be produced using atmospheric pressure chemical vapor deposition, such as is described above, by addition of a dopant precursor to the deposition process. However, it is not as critical that the process be halogen-free. Halogen-containing dopant precursors, for example, hexafluoro-2,4-pentanedione (hexafluoroaceylacetone, hfac) containing chelates of the dopant may be used as dopant precursors to form p-type tin oxide layers. The tin oxide precursor and the dopant precursor are conjoined. The tin oxide precursor and dopant precursor may be conjoined by premixing the tin oxide precursor and the dopant precursor prior to vaporization, by mixing a tin oxide precursor stream and a dopant precursor stream at the vaporization nozzle, or by mixing a vaporized tin oxide precursor stream and a vaporized dopant precursor stream in the region just above the substrate. The tin oxide precursors described above, such as doubly distilled tetrabutyltin, may be used.

p-Type conductivity is achieved by doping with Group 13 elements (B, Al, Ga, In, and Tl) and/or Group 15 elements (N, P, As, Sb, Bi), preferably with Al (aluminum), Ga (gallium), and/or In (indium). Using these dopants, room temperature hole concentrations of about 0.3-31×$10^{16}$ $cm^{-3}$, and as high as about 100×$10^{16}$ $cm^{-3}$, can be achieved. However, doping with B (boron) and with P (phosphorus) was unsuccessful, possibly due to high impurity content in the layers. Typical dopant concentrations for doped p-type tin oxide layers produced by this method are about 0.5 mol % to about 6 mol %, as determined by X-ray Photoelectron Spectroscopy.

The dopant precursor may be any volatile compound of the desired dopant that is sufficiently stable to withstand the conditions of the atmospheric pressure chemical vapor deposition process and produces doped tin oxide. Examples of aluminum precursors are $R_2AlR'$ where R is a $C_1$-$C_8$ straight, branched, aliphatic, cycloaliphatic or unsaturated hydrocarbyl; and R' is R, H, or acetylacetonate (acac), 2,2,6,6-tetramethyl-3,5-heptanedionate (tmhd), or hexafluoro-2,5-pentanedionate (hfac). Examples of Ga and In precursors include $R_2GaR'$ and $R_2InR'$ where R is a $C_1$-$C_4$ straight, branched, aliphatic, cycloaliphatic or unsaturated hydrocarbyl and R' is R, H or acetylacetonate. Useful precursors include aluminum tri-sec-butoxide, trioctylaluminum, $Ga(acac)_3$, and $In(acac)_3$.

When commercially available materials, such as trioctylaluminum, tri-sec-butoxyaluminum, the triacetonylacetonates of aluminum, gallium or indium, and the tris-2,2,6,6-tetramethyl-3,5-heptadionato derivatives of aluminum, gallium or indium were used during doping of the tin oxide layers, the room temperature hole concentration was small, about $0.3\times10\times10^{16}$ $cm^{-3}$. In addition, the commercially available materials have several disadvantages. Volatile alkyl metalorganics, such as $R''_3M$, in which M is Al, Ga, or In, and R" is methyl or ethyl, are pyrophoric and are essentially impossible to use in atmospheric pressure chemical vapor deposition due to strong pre-reaction in the line. In addition, as shown in Table 6, although acetonylacetone (acac), hexafluro-2,4-pentanedione (hfac), and 2,2,6,6-tetramethyl-3,5-heptadione (tmhd) derivatives of these metals are air stable, they are solids at room temperature, have very low vapor pressures and have a tendency to sinter and to decompose when heated. $In(tmhd)_3$, $Ga(tmhd)_3$, $In(acac)_3$, and $Ga(acac)_3$, for example, decompose before the partial pressure necessary for tin oxide doping can be reached.

To overcome these problems, new dopant precursors have been developed. These dopant precursors have the general formula:

$$(R_1)_nM(R_2)_m$$

in which $R_1$ is a $C_1$-$C_8$ straight, branched, aliphatic, cycloaliphatic or unsaturated hydrocarbyl, $R_2$ is a bidentate ligand that bonds through oxygen atoms; M is Al, Ga, or In; m is 1 or 2; n is 1 or 2; and n+m=3.

Typical $R_1$ groups include, for example, methyl (Me), ethyl (Et), vinyl, n-propyl, i-propyl, n-butyl, sec-butyl, n-pentyl, n-hexyl, and n-octyl. Typical $R_2$ groups include, for example, the bidentate ligands formed by enolization of a beta-dicarbonyl compound, such as acetylacetone (acac), 2,4-heptanedione, 3,5-heptanedione, hexafluoro-2,4-pentanedione (hfac), and 2,2,6,6-tetramethyl-3,5-heptanedione (tmhd), or the enolization of a beta-keto-ester for example, acetoacetic ester such as ethyl acetoacetate, n-propyl acetoacetate, n-butyl acetoacetate, and methyl acetoacetate.

Especially useful dopant precursors for the preparation of doped p-type conductive tin oxide include $Al(acac)Et_2$, $Ga(acac)Me_2$, $In(acac)Me_2$, and $In(tmhd)Me_2$. These compounds are either liquids or low melting solids, stable, and, unlike dopant precursors such as aluminum alkyls, are not pyrophoric. Properties of these materials are given in Table 7, below.

Doped p-type tin oxide layers having hole concentrations greater than about $8\times10^{17}$ $cm^{-3}$ have been produced. Doped p-type conductive tin oxide layers having low resistivity (about 10-600 Ωcm) with hole concentrations of about $0.1$-$3.1\times10^{17}$ $cm^{-3}$ at room temperature have been produced using these dopant precursors in the atmospheric pressure chemical vapor deposition and the conditions described above.

INDUSTRIAL APPLICABILITY

The tin oxide coated substrates of the invention are useful in applications requiring excellent electrical properties, such as, for example, light emitting diodes (LED), lasers, photovoltaics, transparent transistors, and organic light emitting diodes (OLED). LED's, for example, can be made using layers in which the hole concentration is at least about $1\times10^{17}$ $cm^{-3}$. Improved color stability and environmental stability are found in devices incorporating these tin oxide coated substrates. Devices using these compositions are characterized by low heat generation per Watt of electricity transmitted.

LED and OLED devices are used in, for example, flat panel displays, such as camera displays, monitors, TV screens, advertising posters, PDAs, cell phones, stereo and clocks. They may also be used in area lighting applications including point source lighting, such as bulb and tubular devices, and panel lighting, such as flat panels, bent panels, formed panels, wall coverings and ceiling coverings.

The advantageous properties of this invention can be observed by reference to the following examples, which illustrate but do not limit the invention.

EXAMPLES

General Procedure for the APCVD Deposition of Electroconductive Tin Oxide Layers Tin oxide layers were deposited by atmospheric pressure chemical vapor deposition (APCVD) using a system similar to that described in Russo, U.S. Pat. No. 4,601,917, the disclosure of which is incorporated herein by reference. Tetrabutyltin (95.8% purity by GC/mass spec), which had been purified by double distillation to achieve better than 99.9% purity, was used as the tin oxide precursor. It was injected into a vaporizer kept at 150-170° C. at a predetermined rate using a Harvard Apparatus syringe pump. Pre-heated (150-170° C.) nitrogen (99.998), dry air or pure oxygen (99.995) was used to transfer the tin precursor to a substrate heated to (630-720° C.). Borosilicate glass substrates, 1.1 cm thick, were used during the deposition. Glass substrates were cleaned with ammonium hydroxide solution and blown dry with nitrogen gas. Then, the substrates were ultrasonically degreased in 50/50 acetone/2-propanol solution for 2 minutes. Cleaned substrates were heated for 10 minutes in air at 400° C.

The layer thickness was measured using a stylus-type profilometer. To prepare the step pattern, tin oxide layers were etched with 10% hydrochloric acid in the presence of zinc powder as described in Sargent, U.S. Pat. No. 4,040,892.

Room temperature Hall effect measurements were conducted using the 4-probe van der Paw method. Magnetic field and current were 0.9-1.0 Tl and 2-15 mA, respectively. Sheet resistances were measured with an Alessi 4-point probe with 0.051 mm tip radii, spaced 1.02 mm apart.

Examples 1-1 to 1-7 and Comparative Examples C1-1 to C1-4

This example illustrates effect of carrier gas flow rate on electrical properties of undoped tin oxide layers. Tin oxide layers were produced by the process described in the General Procedure. The flow rate of tetrabutyltin was optimized at 0.1 mmole/min. The experimental conditions and electrical properties for the resulting undoped n-type tin oxide layers are shown in Table 2.

TABLE 2

| Example No. | Thickness (μm) | Mobility (μ) ($cm^2$/Vs) | Electron Concentration (n) ($10^{16}$ $cm^{-3}$) | $N_2$ (L/min) | $N_2O$ (L/min) | $O_2$ (sccm) |
|---|---|---|---|---|---|---|
| 1-1 | 1.00 | 74 | 3.2 | 8 | 3 | 80 |
| 1-2 | 2.10 | 94 | 2.1 | 8 | 3 | 80 |
| 1-3 | 1.04 | 76.5 | 5 | 8 | 3 | 40 |
| 1-4 | 0.96 | 56 | 3.5 | 8 | 3 | 20 |

TABLE 2-continued

| Example No. | Thickness (μm) | Mobility (μ) ($cm^2$/Vs) | Electron Concentration (n) ($10^{16}$ $cm^{-3}$) | $N_2$ (L/min) | $N_2O$ (L/min) | $O_2$ (sccm) |
|---|---|---|---|---|---|---|
| 1-5 | 1.03 | 60 | 3 | 9 | 3 | 80 |
| 1-6 | 1.08 | 57 | 3.2 | 8 | 4 | 80 |
| 1-7 | 1.10 | 57.5 | 2.7 | 8 | 2 | 80 |
| C1-1 | 1.05 | 35 | 3.1 | 8 | 3 | 500 |
| C1-2 | 1.00 | 32 | 4.5 | 8 | 3 | 0.0 |
| C1-3 | 0.71 | 17 | 3.4 | 16 | 3 | 0.0 |
| C1-4 | 0.83 | 13 | 5 | 9 | 1 | 0.0 |

As shown in Table 2, when the oxygen gas flow rate was 0.0, the electron mobility was less than 36 $cm^2$/Vs. When the oxygen flow rate was increased from 0 to 80 $cm^3$/s, electron mobility, for the equal thickness samples, was greater than 36 $cm^2$/Vs, increasing to 57 $cm^2$/Vs to 94 $cm^2$/Vs. However, when oxygen flow rate was more than about 80 $cm^3$/s, the mobility was less than 36 $cm^2$/Vs. When the nitrogen gas flow rate was greater than about 10 L/min, the mobility decreased. When the nitrous oxide flow rate was about 1 L/min, the mobility decreased to about 10 $cm^2$/Vs.

Examples 2-1 to 2-3

This example illustrates the effect of annealing conditions on the electrical properties of tin oxide layers. Undoped n-type tin oxide layers produced as in Example 1 were annealed at different conditions. The flow rate of tetrabutyltin was optimized at 0.1 mmole/min. The annealing conditions and the electron concentrations (n) and mobilities (μ) of the resulting tin oxide layers are shown in Table 3. (ND means Not Determined.)

TABLE 3

| Example | n ($10^{16}$ $cm^{-3}$) As-grown | | μ ($cm^2$/Vs) As-grown | | n ($10^{16}$ $cm^{-3}$) 410 K-vacuum | | μ ($cm^2$/Vs) 410 K-vacuum | |
|---|---|---|---|---|---|---|---|---|
| No. | 290 K | 120 K | 290 K | 120 K | 290 K | 120 K | 290 K | 120 K |
| 2-1 | 2.1 | 0.65 | 94 | 135 | 2.6 | 1.2 | 111 | 211 |
| 2-2 | 2.7 | 1.1 | 66 | 32 | 4.6 | 2.9 | 85 | 85 |
| 2-3 | 3.86 | ND | 63 | ND | ND | ND | ND | ND |

| Example | n ($10^{16}$ $cm^{-3}$) 510 K-vacuum | | μ ($cm^2$/Vs) 510 K-vacuum | | n ($10^{16}$ $cm^{-3}$) 410 K-air | | μ ($cm^2$/Vs) 410 K-air | |
|---|---|---|---|---|---|---|---|---|
| No. | 290 K | 120 K | 290 K | 120 K | 290 K | 120 K | 290 K | 120 K |
| 2-1 | 4.7 | 2.24 | 98 | 238 | 2.4 | 0.8 | 113 | 243 |
| 2-2 | 7.5 | 2.7 | 85 | 143 | 10 | 3.6 | 87 | 172 |
| 2-3 | 9.8 | 5.6 | 62 | 100 | 14 | 4.8 | 64 | 150 |

Example 3

Several 1-2 μm-thick layers were deposited on borosilicate glass substrates as described in the General Procedures. The substrate temperature was 600° C. The conditions were 8 L/min of nitrogen gas, 3 L/min of nitrous oxide, and 80 sccm of oxygen gas. The layers were annealed at 610 K for 20 minutes in vacuum followed by 20 minutes anneal in air at 410 K.

Background electron concentrations and mobilities for optimized samples were about n=1-4×$10^{16}$ $cm^{-3}$, μ=50-115 $cm^2$/Vs at room temperature. The best sample had an n=3×$10^{16}$ $cm^{-3}$, μ=115 $cm^2$/Vs at room temperature, and n=8-14×$10^{15}$ $cm^{-3}$, μ=243 $cm^2$/Vs at 100 K. When the same samples were annealed under nitrogen at 650 K for 20 minutes, the low temperature electrical properties were further improved. The electron concentrations and mobilities at 100 K were n=300-372 $cm^2$/Vs, and μ=0.5-1×$10^{17}$ $cm^{-3}$.

Examples 4-1 to 4-5

Undoped and ammonia ($NH_3$)-doped tin oxide layers were deposited as described in the General Procedures, and the electrical properties of the resulting layers measured at room temperature. The layers were then annealed in both vacuum and nitrogen at 670° K for 20 minutes. The electrical properties of the annealed samples were measured. The electrical properties of undoped and $NH_3$ doped samples for as-grown, air, nitrogen and vacuum annealed samples, as measured by Hall-effect at 293K, are shown in Table 4, in which resistivity is indicated by "ρ". This table shows that annealing at 670 K in nitrogen, for example, can increase electron mobility from 0.5 $cm^2$/Vs to 71 $cm^2$/Vs and decrease electron concentration from 1.1×$10^{18}$ $cm^{-3}$ to 2.8×$10^{17}$ $cm^{-3}$.

TABLE 4

| Example No. | $NH_3$ sccm | ρ (Ωcm) (a) | ρ (b) | ρ (c) | μ ($cm^2$/Vs) (a) | μ (b) | μ (c) |
|---|---|---|---|---|---|---|---|
| 4-1 | 0.0 | 0.50 | 0.28 | 0.25 | 31.2 | 47.9 | 58 |
| 4-2 | 1.0 | 5.3 | 3.5 | 0.5 | 0.9 | 12 | 49 |
| 4-3 | 1.25 | 5.7 | 2.5 | 0.7 | 1.6 | 13 | 54 |
| 4-4 | 2.5 | 12.1 | 2 | 0.3 | 0.5 | 24 | 71 |
| 4-5 | 5 | 34.8 | 7.9 | 4.5 | 0.19 | 3.1 | 10 |

TABLE 4-continued

| Example No. | $NH_3$ Sccm | n ($10^{16}$ $cm^{-3}$) (a) | (b) | (c) |
|---|---|---|---|---|
| 4-1 | 0.0 | 39 | 46 | 44 |
| 4-2 | 1.0 | 140 | 15 | 26 |
| 4-3 | 1.25 | 66.7 | 18.9 | 16 |
| 4-4 | 2.5 | 110 | 13 | 28 |
| 4-5 | 5 | 105 | 25.6 | 14 |

(a) - as-grown samples;
(b) - air-annealed;
(c) - $N_2$ annealed

FIG. 1 is a graph showing the effect of mobility as a function of measurement temperature under different annealing conditions for Example 4-3.

Example 5

Undoped tin oxide layers were formed on Si(100) substrates heated to 543° C., 636° C., and 730° C. In each case, a highly textured tin oxide layer with a (311) predominate orientation was obtained on the Si(100) substrate. The lowest electron concentration was obtained at the highest deposition temperature (730° C.).

The X-ray spectra of the $SnO_2/SiO_2/Si(100)$ layers were determined. X-ray diffraction was measured using a Philips APD 3720 X-ray diffractometer with fixed slit optics under the following conditions: Tube current=35 mA, Tube voltage=45 kV, Radiation Cu K-alpha, Divergence slit=1°, Receiving slit=0.2°, Range 2 theta=20-90°, Dwell time=2 s and Step size=0.02°.

The relative prominence of the preferred orientation [hkl] with respect to the other observed reflections is expressed in terms of a texture coefficient, TC, $$TC(hkl) = \frac{I(hkl)/I_0(hkl)}{\sum_N I(hkl)/I_0(hkl)} \quad (1)$$

The texture coefficient shows the degree of crystal alignment. The texture coefficients span a range from 0.167 for powders (non oriented samples) to 1.0 for the samples oriented in one direction. TC(311) was 0.99 for most of the samples. Several samples were oriented along the <311> direction with a TC of 0.99 when grown on Si (100).

The method provides tin oxide layers with a predominate orientation of (311) with TC(311)~99% (100% is a fully textured material with one predominate orientation). Highly textured tin oxide layers also were obtained with monobutyl-tin-trichloride and dibutyltin diacetate, with some water added as a rate accelerator.

Example 6

This Example illustrates the production of p-type tin oxide. The electrical properties at 290 K for tin oxide layers produced by APCVD using various dopants are shown in Table 5. Seebeck and Hall effect measurements were carried out using MMR Technology Seebeck (Hall)-effects measuring stages.

TABLE 5

| Dopant | Source | Type | n, p × $10^{16}$ $cm^{-3}$ |
|---|---|---|---|
| B | Tri-iso-propylboron | n-type | 30 |
| N | Ammonia | n-type | 60 |
| B + P | Tri-iso-propylboron and tri-iso-propyl phosphate | n-type | 40 |
| Al | Trioctylalumminum | p-type* | — |
| | Aluminum tributoxide | p-type* | — |
| | $Al(acac)(C_2H_5)_2$ | p-type | 8-26 |
| Ga | $Ga(acac)_3$ | p-type | 0.3 |
| In | $In(acac)_3$ | p-type | 1.5-10 |
| | $In(acac)(CH_3)_2$ | p-type | 21-31 |

*Seebeck effect measurements

Figure 2:
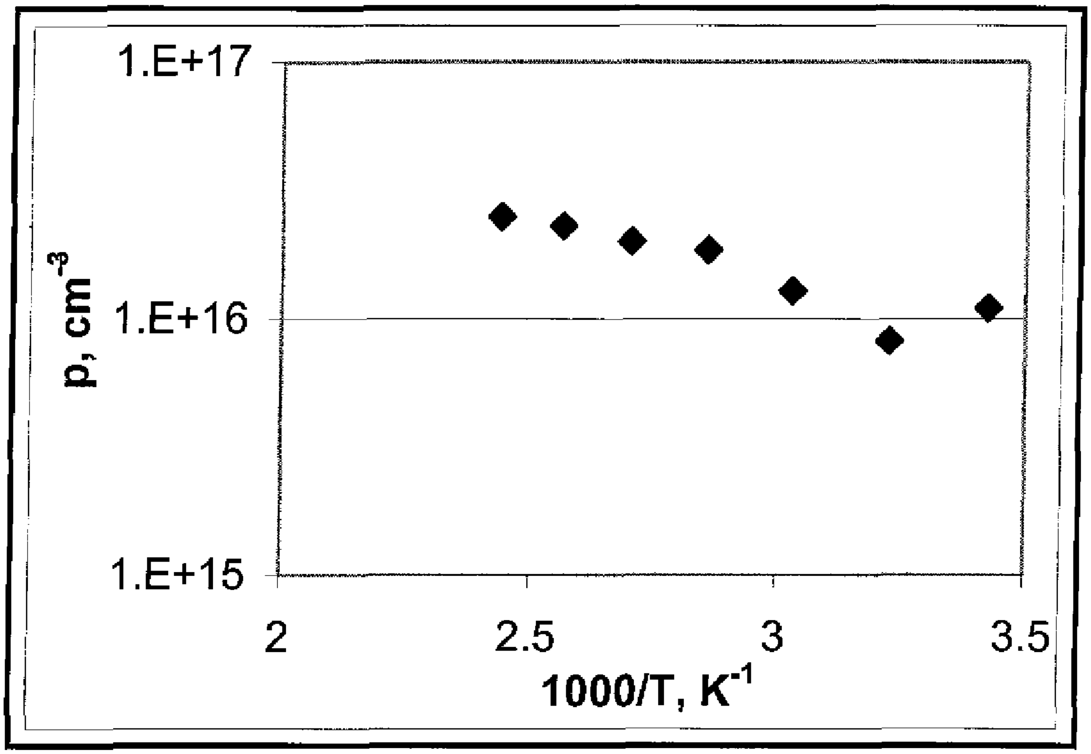
FIG. 2 is a graph of the hole concentration of $SnO_2$:Ga as a function of measurement temperature.
Figure 3:
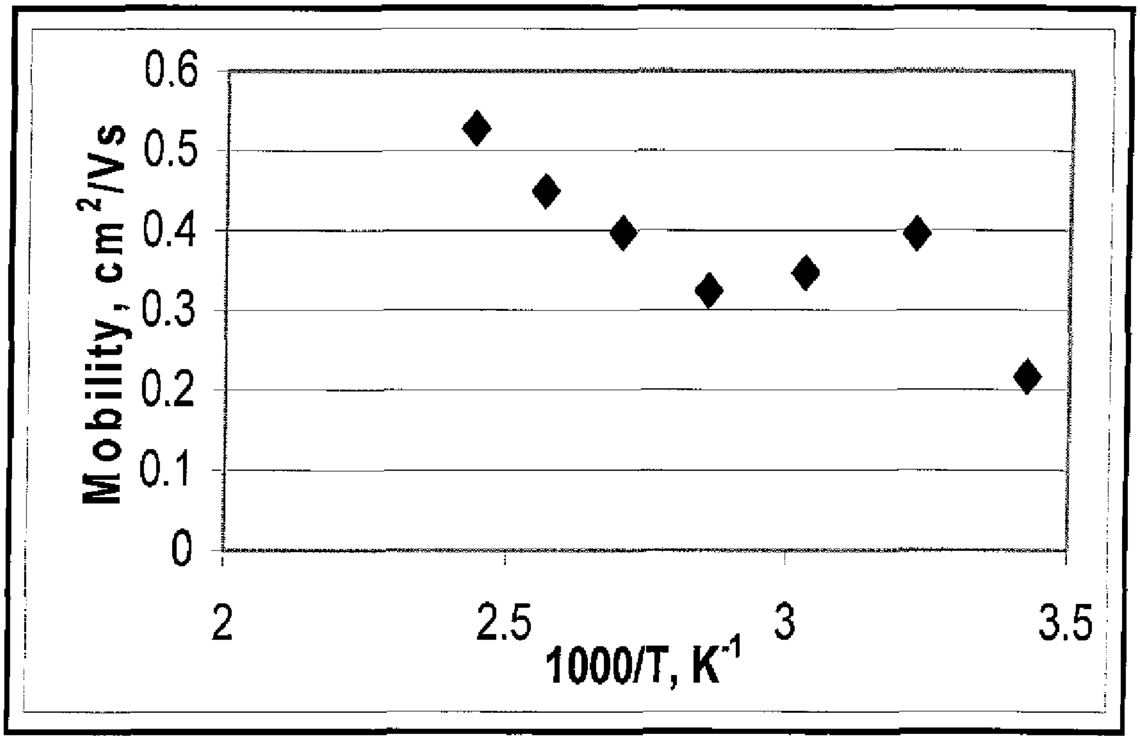
FIG. 3 is a graph of the hole mobility of $SnO_2$:Ga as a function of measurement temperature.

FIG. 2 is a graph of the hole concentration (ρ) of $SnO_2$:Ga as a function of the Hall measurement temperature. The layers were annealed for 20 min at 510 K in vacuum followed by 10-15 min anneal at 410 K in air before the Hall measurements were taken. FIG. 3 is a graph of the hole mobility of $SnO_2$:Ga as a function of temperature.

Example 7

The example illustrates the preparation of a dopant precursor. The glassware was first heated in the oven to about 110° C. for 15-30 minutes to remove some traces of water. The reaction was conducted inside a hood using a Schlenk-line set up in which the purity of the nitrogen was 99.998%. The stirrer was started to ensure proper mixing during later steps, and the 3-neck reaction flask was placed inside the dry-ice bath to be able to control the exothermic nature of this reaction. The nitrogen flow rate was regulated to 1 bubble per second during this reaction.

Anhydrous diethyl ether (30 ml) was first introduced into the 3-neck flask using a cannula transfer technique by pushing with nitrogen, and cooled in a dry ice/iso-propyl alcohol bath. Trimethylgallium (3.44 g), which is pyrophoric, was added to the diethyl ether in the 3-neck flask by cannula transfer. Distilled acetylacetone (3.2 mL) from a Schlenk-flask stored under nitrogen was added into an addition funnel filled with diethyl ether with a 5 ml syringe purged with nitrogen. The addition funnel content was stirred with a flow of nitrogen by the septum from its top.

The acetylacetone solution was added slowly drop-wise to the reaction mixture, and an exothermic reaction ensued. After the addition was complete, the cooling bath was removed, and the reaction allowed to warm to room temperature and stirred for 90 minutes. The solvent was removed under vacuum and the $Ga(acac)(CH_3)_2$ product dried under vacuum for 45 minutes.

Example 8

The physical and chemical properties of various commercial Al, Ga, and In dopant precursors are given in Table 6.

TABLE 6

| Dopant Precursor[a] | Melting Point (° C.) | Boiling Point (° C.) | Decomposition Temperature (° C.) | Air-sensitivity |
|---|---|---|---|---|
| $In(acac)_3$ | 187 | — | 160 | Stable |
| $In(CH_3)_3$ | 88 (85.7) | 133.8 | 162 | pyrophoric |
| $In(tmhd)_3$ | 167 | — | 155 | stable |
| $In(hfac)_3$ | 118 | — | — | stable |
| $Al(CH_3)_3$ | 15.4 | 127 | — | pyrophoric |
| $Al(C_2H_5)_3$ | −52.5 | 194 | — | pyrophoric |
| $Ga(CH_3)_3$ | −15.8 | 55.7 | — | pyrophoric |
| $Ga(C_2H_5)_3$ | −82.3 | 143 | — | pyrophoric |

[a]acac is acetonylacetonate; tmhd is 2,2,6,6-tetramethyl-3,5-heptanedionate; and hfac is hexafluoroacetonylacetonate.

The physical and chemical properties of Al, Ga, and In dopant precursors prepared for this work are given in Table 7. These data were obtained using inert differential thermal analysis. The chemical structure of the dopant precursors was verified by $^1H$ and $^{13}C$ NMR.

TABLE 7

| Dopant Precursor[a] | Melting Point (° C.) | Boiling Point (° C.) | Decomposition Temperature (° C.) | Mass Evaporated (%) | Air sensitivity |
|---|---|---|---|---|---|
| $In(acac)(CH_3)_2$ | 128 | Decom. | 155 | 17 | stable |
| $In(tmhd)(CH_3)_2$ | Liquid | Decom. | 155 | 5 | stable |
| $Ga(acac)(CH_3)_2$ | Liquid | 125 | — | 100 | stable |
| $Al(acac)(C_2H_5)_2$ | Liquid | 170 | 205 | 80 | Slightly sensitive |

[a]acac is acetonylacetonate and tmhd is 2,2,6,6-tetramethyl-3,5-heptanedionate.

In and Al doping of tin oxide was performed using these new precursors. Hall-effect measurements indicated low resistivity layers (500-600 Ωcm) with hole concentrations of $0.1\text{-}3.1\times10^{17}\ cm^{-3}$ at room temperature. Use of $In(acac)(CH_3)_2$ and $Al(acac)(C_2H_5)_2$ as dopant precursors is described in Example 5.

Having described the invention, we now claim the following and their equivalents.

What is claimed is:

1. A method for preparing a doped, p-type tin oxide layer on a substrate, the method comprising the step of:

depositing the tin oxide layer on the substrate by atmospheric pressure chemical vapor deposition using a tin oxide precursor in a carrier gas; in which:

the tin oxide precursor comprises a vaporizable tin compound;

the tin oxide precursor comprises less than about 0.01 weight percent total d and f transition metals;

the carrier gas comprises nitrogen, nitrous oxide, and oxygen;

the flow rates are nitrogen, 2-20 L/min; nitrous oxide, 1-10 L/min; and oxygen, 20-160 $cm^3$/min; and the carrier gas additionally comprises a dopant precursor;

the dopant precursor is an Al, Ga, or In compound; and the resulting tin oxide is doped, p-type tin oxide.

2. The method of claim 1 in which the tin oxide layer has a hole concentration of at least about $1\times10^{17}\ cm^{-3}$.

3. The method of claim 1 in which the tin oxide layer has a hole concentration of $0.3\text{-}100\times10^{16}\ cm^{-3}$ at room temperature.

4. The method of claim in which the dopant is Al.

5. The method of claim 3 in which the dopant is Ga.

6. The method of claim 2 in which the dopant is In.

7. The method of claim 1 in which the dopant precursor is $(R_1)_nM(R_2)_m$, in which $R_1$ is a $C_1$-$C_8$ straight, branched, aliphatic, cycloaliphatic or unsaturated hydrocarbyl, $R_2$ is a bidentate ligand that bonds through oxygen atoms; M is Al, Ga, or In; m is 1 or 2; n is 1 or 2; and n+m=3.

8. The method of claim 7 in which $R_1$ is methyl or ethyl, and $R_2$ is acac, tmhd, or hfac.

9. The method of claim 7 in which the tin oxide layer has a hole concentration of at least about $1\times10^{17}\ cm^{-3}$.

10. The method of claim 9 in which the flow rates are nitrogen, 4-10 L/min; nitrous oxide, 2-4 L/min; and oxygen, 50-100 $cm^3$/min.

* * * * *